US007965114B2

(12) United States Patent
Lee et al.

(10) Patent No.: US 7,965,114 B2
(45) Date of Patent: Jun. 21, 2011

(54) SOURCE DRIVER AND METHOD FOR RESTRAINING NOISE THEREOF

(75) Inventors: Chuan-Che Lee, Tainan County (TW); Tsung-Yu Wu, Tainan County (TW); Yu-Jui Chang, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 888 days.

(21) Appl. No.: 11/940,031

(22) Filed: Nov. 14, 2007

(65) Prior Publication Data

US 2009/0058194 A1 Mar. 5, 2009

(30) Foreign Application Priority Data

Aug. 30, 2007 (TW) ............................... 96132304 A

(51) Int. Cl.
*H03L 7/00* (2006.01)
*G06F 3/038* (2006.01)

(52) U.S. Cl. ........ 327/143; 327/100; 327/141; 327/142; 345/204; 345/211; 345/212

(58) Field of Classification Search .................. 327/100, 327/108, 141, 142, 143, 524, 544; 345/87, 345/98, 100, 204, 211, 212
See application file for complete search history.

(56) References Cited

U.S. PATENT DOCUMENTS

| | | | | |
|---|---|---|---|---|
| 6,069,605 | A * | 5/2000 | Ozawa | 345/98 |
| 6,639,590 | B2 * | 10/2003 | Takahashi et al. | 345/211 |
| 7,782,097 | B2 * | 8/2010 | Lee et al. | 327/108 |
| 2008/0024480 | A1 * | 1/2008 | Jee et al. | 345/212 |
| 2008/0129903 | A1 * | 6/2008 | Hong et al. | 349/36 |
| 2009/0066378 | A1 * | 3/2009 | Lee et al. | 327/143 |

* cited by examiner

*Primary Examiner* — My-Chau T Tran

(57) ABSTRACT

The present invention discloses a source driver and a method for restraining noise output by a source driver during power on/off of a power supply. The source driver includes a multiplexer, at least two channels and at least two output pads. The channels are connected to the output pads via the multiplexer. The source driver is powered by a first supply voltage from the power supply. The two output pads are connected via a charge sharing switch. The method comprises the following steps. First, determine whether the first supply voltage is insufficient, and if yes, perform the following steps. Turn off the charge sharing switch. Then, disconnect the channels from the output pads by the multiplexer.

20 Claims, 4 Drawing Sheets

SOURCE DRIVER AND METHOD FOR RESTRAINING NOISE THEREOF

RELATED APPLICATIONS

This application claims priority to Taiwan Application Serial Number 96132304, filed Aug. 30, 2007, which is herein incorporated by reference.

FIELD OF THE INVENTION

This invention relates to a source driver and a method for restraining noise thereof, and more particularly, to a source driver and a method for restraining noise output by a source driver during power on/off of a power supply.

BACKGROUND OF THE INVENTION

Recently, liquid crystal displays (LCD) have been widely applied in electrical products due to the rapid progress of optical technology and semiconductor technology. Moreover, with advantages of high image quality, compact size, light weight, low driving voltage and low power consumption, LCDs have been introduced into portable computers, personal digital assistants and color televisions, and have become the mainstream display apparatus.

FIG. 1 shows a diagram of a conventional source driver 100 of the LCD. The source driver 100 includes at least two channels (108,110), a multiplexer 112, at least two output pads (114,116), a data bus 118 and a charge sharing switch 120. The channels 108 and 110 are connected to the output pads 114 and 116, respectively, via the multiplexer 112. The charge sharing switch 120 is electrically connected between the output pads 114 and 116 to share the voltages on the outputs if needed. Each channel has a shift register (122 or 132), a latch unit (123 or 133), a level shifter (128 or 138) and a digital-to-analog converter (DAC) (130 or 140). Each latch unit comprises a first latch (124 or 134) and a second latch (126 or 136) connected in series. The data is transmitted on the data bus 118 and stored in the latch units, and moreover, the data is stored first in the first latch and then stored in the second latch. The data is further sent to a display (not shown) via the output pads 114 and 116 to show corresponding images on the display.

However, when the power supply powering the source driver is being turned off, the power supplying to the source driver decreases and the channels may malfunction owing to the power insufficient, which results in abnormal images, such as line defects or band mura, shown on the display.

SUMMARY OF THE INVENTION

Therefore, an aspect of the present invention is to provide a source driver and a method for restraining noise thereof in which abnormal images shown on the display during power on/off of a power supply can be restrained.

Another objective of the present invention is to provide a source driver with a power down detector for detecting whether the power supply is turning on/off and if yes, asserting a reset signal.

In order to achieve the aforementioned aspects, the present invention provides a method for restraining noise output by a source driver during power on/off of a power supply. The source driver includes a multiplexer, at least two channels and at least two output pads. The channels are connected to the output pads via the multiplexer. The source driver is powered by a first supply voltage from the power supply. The two output pads are connected via a charge sharing switch. The method comprises the following steps. The method determines whether the first supply voltage is insufficient, and if yes, performs the following steps. It turns off the charge sharing switch. Then, it disconnects the channels from the output pads by the multiplexer.

To achieve the aforementioned aspects, the present invention provides a source driver powered by a power supply. The source driver comprises at least two channels, a multiplexer, at least two output pads coupled to the channels via the multiplexer, a charge sharing switch connected between the two output pads, and a power down detector for detecting whether a first supply voltage from the power supply is insufficient and, if yes, asserting a reset signal to turn off the charge sharing switch and disconnect the channels from the output pads via the multiplexer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
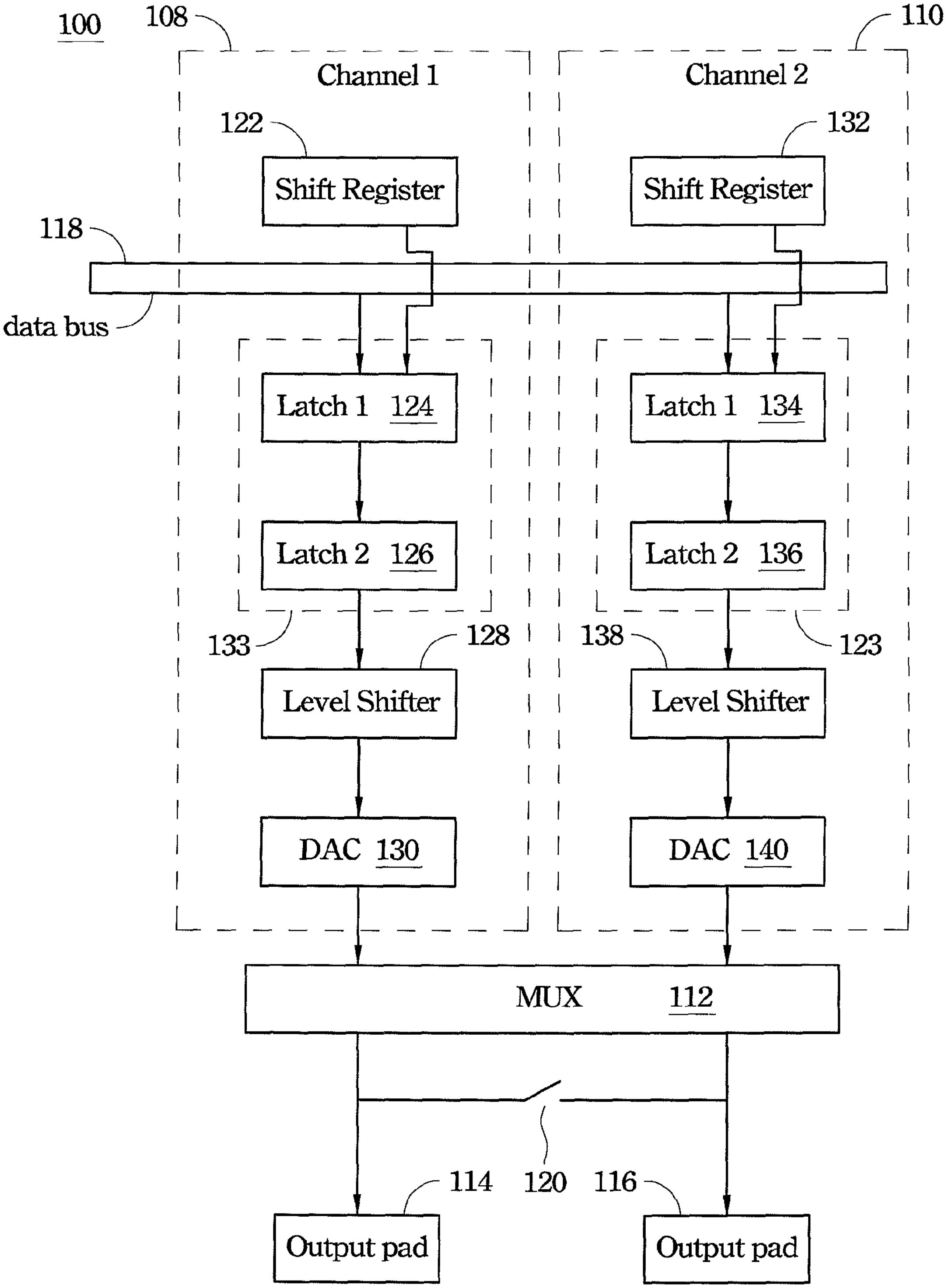
Fig. 1 (Prior Art)
FIG. 1 shows a diagram of a conventional source driver of the LCD.
Figure 2:
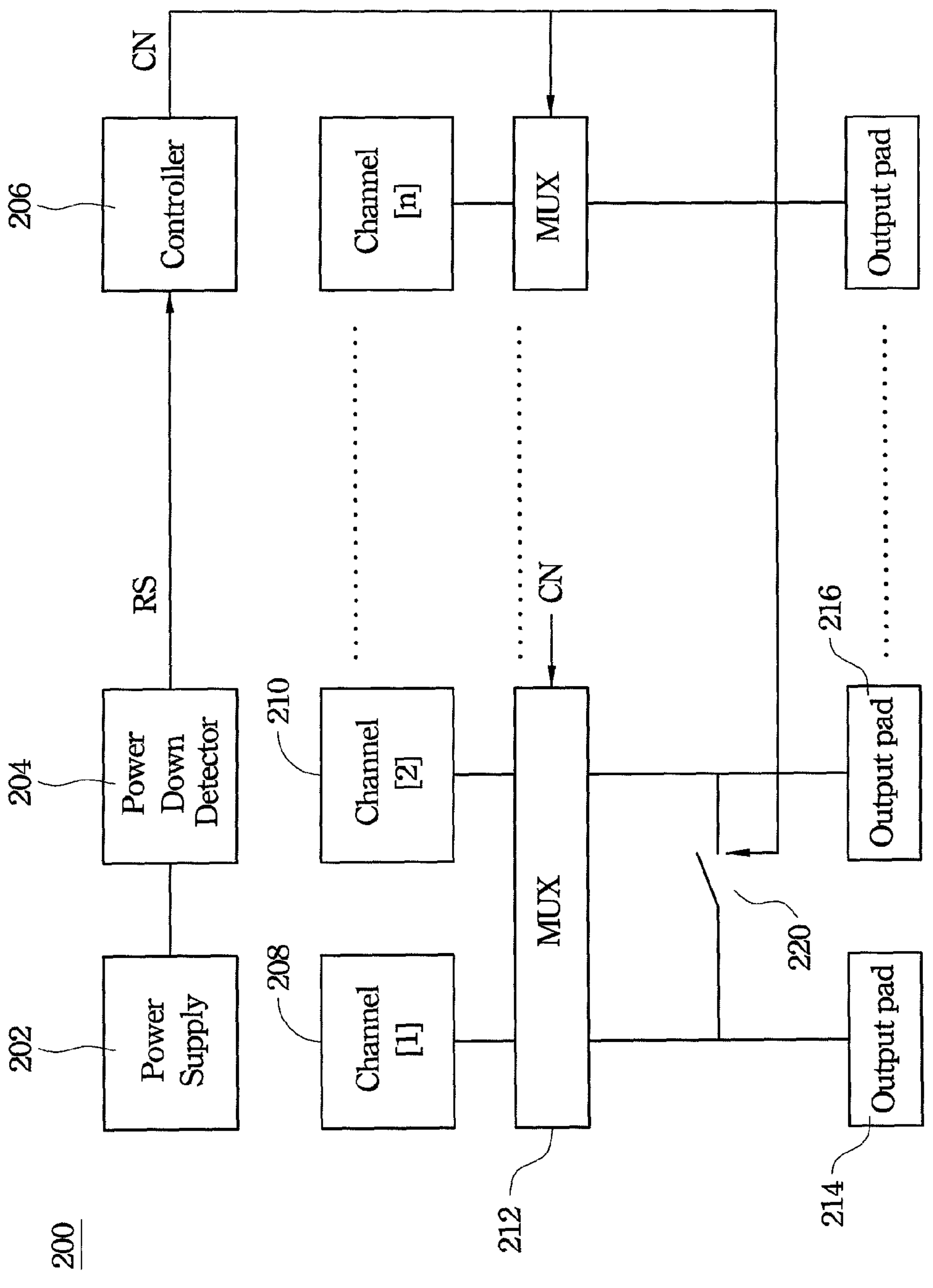
FIG. 2 shows a diagram of a source driver according to a preferred embodiment of the present invention.
Figure 3:
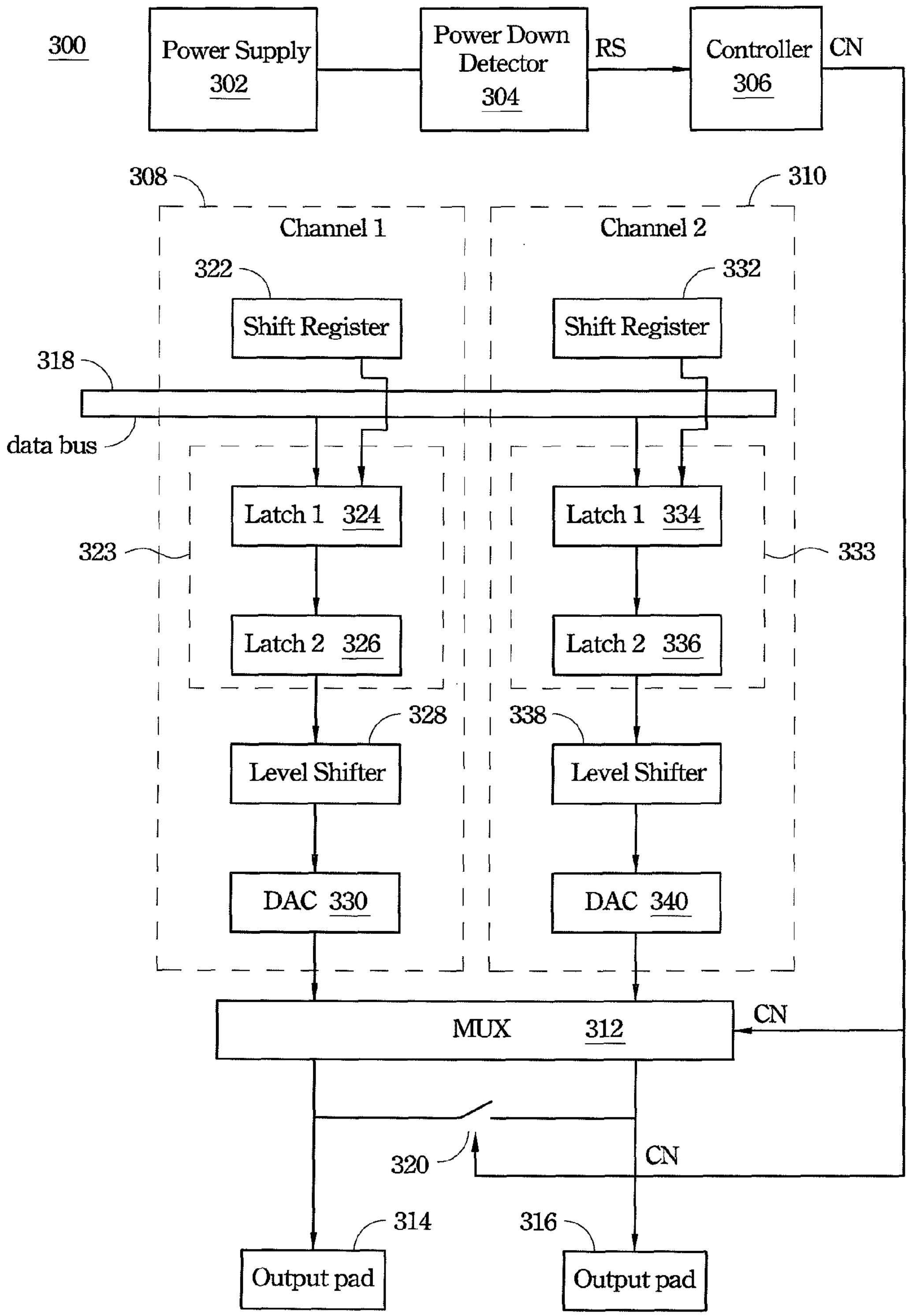
FIG. 3 shows a diagram of another source driver according to the preferred embodiment of the present invention.
Figure 4:
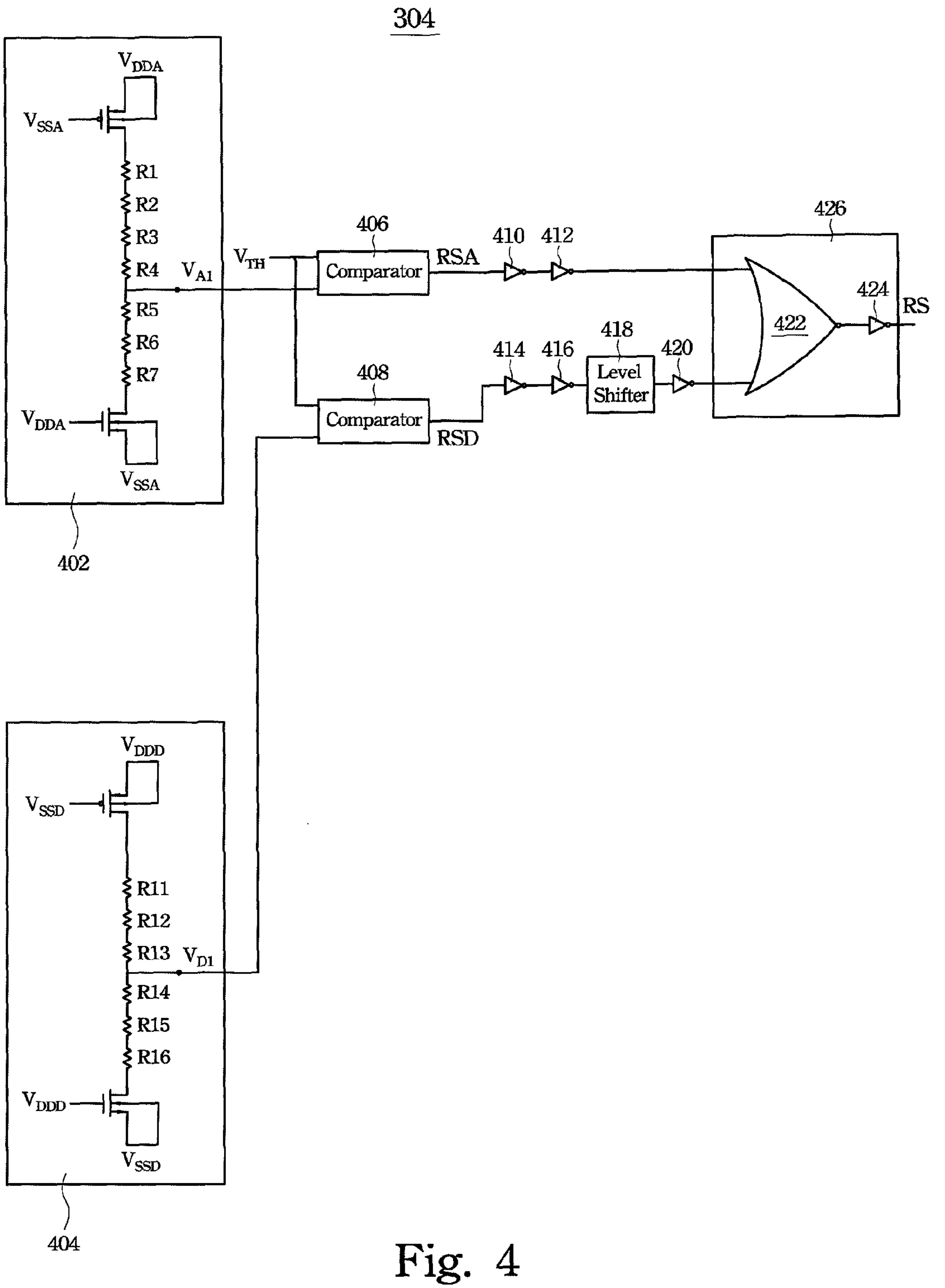
FIG. 4 shows a diagram of the power down detector according to the preferred embodiment of the present invention.

In order to make the illustration of the present invention more explicit and complete, the following description is stated with reference to FIGS. 2 through 4.

FIG. 2 shows a diagram of a source driver according to a preferred embodiment of the present invention. The source driver 200 in FIG. 2 is powered by a power supply 202, and the source driver 200 comprises at least two channels (channel 208, channel 210 . . . ), at least one multiplexer (MUX) 212, at least two output pads (output pad 214, output pad 216 . . . ) coupled to the channels via the multiplexer 212, a charge sharing switch 220 electrically connected between the output pads 214 and 216 to share the voltages on the outputs if needed, a power down detector 204 connected to the power supply 202, and a controller 206 connected to the power down detector 204. The power supply 202 may provide a first supply voltage which is at high level and a second supply voltage which is at low level.

The power down detector 204 determines whether power is turning on or off and generates a reset signal RS if yes. The determination of power on/off is made by detecting whether any one of the first supply voltage and the second supply voltage from the power supply 202 is in sufficient, that is, below certain thresholds.

The reset signal RS is sent to the controller 206. The controller 206 then generates a control signal CN in accordance with the reset signal RS and sends the control signal CN to the charge sharing switch 220 to turn off the charge sharing switch 220. The control signal CN is further sent to the multiplexer to disconnect the channels with the output pads so that the possibly abnormal data would not be transmitted to the output pads when the power supply 202 powering the source driver is being turned on/off. Thus, the display keeps showing the original image during power on/off of the power supply.

FIG. 3 shows a diagram of another source driver according to the preferred embodiment of the present invention. The source driver 300 in FIG. 3 is powered by a power supply 302, and the source driver 300 comprises channels 308 and 310, a multiplexer (MUX) 312, output pads 314 and 316, a data bus 318, a charge sharing switch 320, a power down detector 304 connected to the power supply 302, and a controller 306 connected to the power down detector 304. The output pads 314 and 316 are coupled to the channels 308 and 310 via the multiplexer 312. The charge sharing switch 320 is electrically connected between the output pads 314 and 316 of the source driver 300 to share the voltages on the outputs if needed.

Each channel has a shift register (322 or 332), a latch unit (323 or 333), a level shifter (328 or 338) and a digital-to-analog converter (DAC) (330 or 340). Each latch unit comprises a first latch (324 or 334) and a second latch (326 or 336) connected in series. The data is transmitted on the data bus 318 and stored in the latch units, and moreover, the data is stored first in the first latch and then stored in the second latch.

When the power supply 302 supplies power to the source driver 300 normally, the data in the channels is inputted to the multiplexer 312 and further sent to a display (not shown in the drawing) via the output pads 314 and 316 to show corresponding images on the display. However, when the power supply 302 is being turned on or off, the power sent to the source driver 300 becomes insufficient. The power down detector 304 generates a reset signal RS if the voltage sent from the power supply 302 is insufficient and sends the reset signal RS to the controller 306 to generate a control signal CN based on the reset signal RS. The control signal CN is sent to the charge sharing switch 320 to turn it off. The control signal CN is further sent to the multiplexer 312 to keep the multiplexers 312 in high impedance in order to disconnect the channels 308 and 310 with the output pads 314 and 316. Therefore, the display keeps showing the original image during power on/off of the power supply.

The following describes in detail the structure of the power down detector and the generation of the reset signal RS.

FIG. 4 shows a diagram of the power down detector according to the preferred embodiment of the present invention. The power down detector 304 in FIG. 4 comprises a first voltage divider 402, a second voltage divider 404, a first comparator 406, a second comparator 408, a first inverter 410, a second inverter 412, a third inverter 414, a fourth inverter 416, a level shifter 418, a fifth inverter 420 and an OR gate 426. The OR gate 426 comprises a NOR gate 422 and a sixth inverter 424 connected in series. The first voltage divider 402 includes series-connected resistors R1-R7, and the second voltage divider 404 includes series-connected resistors R11-R16.

The first voltage divider 402 generates a first divided voltage $V_{A1}$ based on the first supply voltage VDDA from the power supply, and the second voltage divider 404 generates a second divided voltage $V_{D1}$ based on the second supply voltage VDDD from the power supply. The first comparator 406 compares the first divided voltage $V_{A1}$ with the threshold voltage $V_{TH}$ and generates a first comparison signal RSA. The first comparison signal RSA is logic high if the first divided voltage $V_{A1}$ is smaller than the threshold voltage $V_{TH}$, inferring that the power supply is insufficient due to being turned on/off. The first comparison signal RSA is logic low if the first divided voltage $V_{A1}$ is greater than the threshold voltage $V_{TH}$, inferring that the power supply supplies power to the source driver normally.

Similarly, the second comparator 408 compares the second divided voltage $V_{D1}$ with the threshold voltage $V_{TH}$ and generates a second comparison signal RSD. The second comparison signal RSD is logic high if the second divided voltage $V_{D1}$ is smaller than the threshold voltage $V_{TH}$, inferring that the power supply is being turned on/off. The second comparison signal RSD is logic low if the second divided voltage $V_{D1}$ is greater than the threshold voltage $V_{TH}$, inferring that the power supply supplies power to the source driver normally. The first supply voltage VDDA is a high voltage compared to the second supply voltage VDDD, and the first comparator is a high-voltage element and the second comparator is a low-voltage element. The setting of the first divided voltage $V_{A1}$, the second divided voltage $V_{D1}$ and the threshold voltage $V_{TH}$ can be determined and changed by users.

The threshold voltage $V_{TH}$ is generated by a circuit that is not easily affected by the decreasing output of the power supply, such as a band-gap voltage generator.

The first comparison signal RSA is sent through the first inverter 410 and the second inverter 412 and to one input node of the OR gate 426. The second comparison signal RSD is sent through the third inverter 414 and the fourth inverter 416 and then to the level shifter 418 to shift the level of the second comparison signal RSD. The level-shifted second comparison signal RSD is further sent through the fifth inverter 420 and to the other input node of the OR gate 426. If the first comparison signal RSA and the second comparison signal RSD are both logic low, the OR gate 426 outputs a logic low signal inferring that the power supply supplies power to the source driver normally so that no reset signal is generated. Contrarily, if the first comparison signal RSA and/or the second comparison signal RSD are/is logic high, the OR gate 426 outputs a logic high signal inferring that the power supply is being turned on/off and the reset signal RS is generated.

According to the aforementioned description, one advantage of the embodiment is that abnormal images shown on the display during power off of a power supply can be restrained.

According to the aforementioned description, yet another advantage of the embodiment is that a power down detector is used in the present invention to detect whether the power supply is being turned on/off and generates a reset signal if yes.

As is understood by a person skilled in the art, the foregoing preferred embodiments of the present invention are strengths of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method for restraining noise output by a source driver during power on/off of a power supply, the source driver including a multiplexer, at least two channels and at least two output pads, the channels being connected to the output pads via the multiplexer, the source driver is powered by a first supply voltage from the power supply, the two output pads are connected via a charge sharing switch, the method comprising:

determining whether the first supply voltage is insufficient, and if yes, performing the following steps:

turning off the charge sharing switch; and disconnecting the channels from the output pads by the multiplexer.

2. The method as claimed in claim 1, wherein the source driver is further powered by a second supply voltage.

3. The method as claimed in claim 2, wherein the determining step further determines whether the second supply voltage is insufficient.

4. The method as claimed in claim 1, wherein the step of turning off the charge sharing switch is performed by sending a control signal to the charge sharing switch.

5. The method as claimed in claim 4, wherein the control signal is generated according to a reset signal.

6. The method as claimed in claim 4, wherein the control signal is generated by a controller.

7. The method as claimed in claim 1, wherein the step of disconnecting the channels from the output pads by the multiplexer is performed by sending a control signal to the multiplexer.

8. The method as claimed in claim 7, wherein the control signal is generated according to a reset signal, and the reset signal is asserted if the result from the determining step is yes.

9. The method as claimed in claim 8, wherein the reset signal is generated by comparing a first divided voltage based on the first supply voltage with a threshold voltage, if the first divided voltage is less than the threshold voltage, the reset signal is generated.

10. The method as claimed in claim 9, wherein the first divided voltage is generated by using a first voltage divider to divide the first supply voltage.

11. The method as claimed in claim 9, wherein the source driver is further powered by a second supply voltage from the power supply, and the reset signal is generated by comparing a second divided voltage based on the second supply voltage with the threshold voltage, if the second divided voltage is less than the threshold voltage, the reset signal is generated.

12. The method as claimed in claim 11, wherein the second divided voltage is generated by using a second voltage divider to divide the second supply voltage.

13. A source driver powered by a power supply, comprising:

at least two channels;

a multiplexer;

at least two output pads, coupled to the channels via the multiplexer;

a charge sharing switch connected between the two output pads; and a power down detector for detecting whether a first supply voltage from the power supply is insufficient and, if yes, asserting a reset signal to turn off the charge sharing switch and disconnect the channels from the output pads via the multiplexer.

14. The source driver as claimed in claim 13, further comprising:

a controller for turning off the charge sharing switch and controlling the multiplexer to disconnect the channels from the output pads based on the reset signal.

15. The source driver as claimed in claim 13, wherein the power down detector comprises:

a first voltage divider for generating a first divided voltage based on the first supply voltage; and a first comparator for comparing the first divided voltage with a threshold voltage to determine whether the first supply voltage is insufficient.

16. The source driver as claimed in claim 15, wherein the power down detector further comprises:

a second voltage divider for generating a second divided voltage based on a second supply voltage from the power supply;

a second comparator for comparing the second divided voltage with the threshold voltage to determine whether the second supply voltage is insufficient; and an OR gate having two input nodes respectively connected to outputs of the first comparator and the second comparator for outputting the reset signal.

17. The source driver as claimed in claim 16, wherein the first voltage divider and the second voltage divider each comprises a plurality of resistors connected in series.

18. The source driver as claimed in claim 17, wherein the first supply voltage is a high voltage compared to the second supply voltage, the first comparator is a high-voltage element and the second comparator is a low-voltage element.

19. The source driver as claimed in claim 18, wherein the power down detector further comprises a level shifter connected between the second comparator and the OR gate.

20. The source driver as claimed in claim 13, wherein the power down detector further detects whether a second supply voltage from the power supply is insufficient, and if yes, assert the reset signal.

* * * * *